United States Patent
Tsuneoka et al.

(10) Patent No.: US 7,180,012 B2
(45) Date of Patent: *Feb. 20, 2007

(54) MODULE PART

(75) Inventors: Michiaki Tsuneoka, Ibaraki (JP); Koji Hashimoto, Kobe (JP); Masaaki Hayama, Nara (JP); Takeo Yasuho, Neyagawa (JP)

(73) Assignee: Mitsushita Electric Industrial Co., Ltd., Osaka (JP)

( * ) Notice: Subject to any disclaimer, the term of this patent is extended or adjusted under 35 U.S.C. 154(b) by 7 days.

This patent is subject to a terminal disclaimer.

(21) Appl. No.: 10/493,437

(22) PCT Filed: Aug. 25, 2003

(86) PCT No.: PCT/JP03/10696

§ 371 (c)(1),
(2), (4) Date: Apr. 23, 2004

(87) PCT Pub. No.: WO2004/021435

PCT Pub. Date: Mar. 11, 2004

(65) Prior Publication Data

US 2004/0252475 A1 Dec. 16, 2004

(30) Foreign Application Priority Data

Aug. 29, 2002 (JP) ............................. 2002-250900

(51) Int. Cl.
*H01L 23/28* (2006.01)
(52) U.S. Cl. ..................... 174/521; 174/260; 257/787
(58) Field of Classification Search ............... 174/260, 174/261, 52.2, 52.1, 52.4, 35 R, 35 GC; 361/760, 736, 737, 753, 752, 800, 796; 257/787, 257/790, 788, 789, 659, 691, 704
See application file for complete search history.

(56) References Cited

U.S. PATENT DOCUMENTS

| | | | |
|---|---|---|---|
| 5,311,059 A | | 5/1994 | Banerji et al. |
| 5,355,016 A | * | 10/1994 | Swirbel et al. ............. 257/659 |
| 5,461,545 A | * | 10/1995 | Leroy et al. ................ 361/765 |
| 5,541,448 A | * | 7/1996 | Carpenter ................... 257/679 |
| 5,600,181 A | * | 2/1997 | Scott et al. ................. 257/723 |
| 5,601,675 A | * | 2/1997 | Hoffmeyer et al. ........... 156/94 |
| 5,694,300 A | * | 12/1997 | Mattei et al. ............... 361/818 |

FOREIGN PATENT DOCUMENTS

| | | |
|---|---|---|
| EP | 1 160 859 A2 | 12/2001 |
| EP | 1 229 577 A2 | 8/2002 |
| JP | 3-179796 | 8/1991 |
| JP | 405129789 A * | 5/1993 |
| JP | 8-288686 | 11/1996 |
| JP | 10-214923 | 8/1998 |
| JP | 8-264871 | 10/1998 |
| JP | 11-163583 | 6/1999 |
| JP | 2001-244688 | 9/2001 |
| JP | 2002-33419 | 1/2002 |

* cited by examiner

*Primary Examiner*—Ishwar (I. B. ) Patel
(74) *Attorney, Agent, or Firm*—Steptoe & Johnson LLP

(57) ABSTRACT

A module component with a good shield effect and a low height including a circuit board having mounted thereon a mount device including an electronic part. The device is sealed with a sealing body having a metal film formed on the sealing body surface. A ground pattern is formed at the outer periphery of the principal surface of the circuit board. The metal film is conductively connected with the ground pattern.

3 Claims, 3 Drawing Sheets

MODULE PART

TECHNICAL FIELD

The present invention relates to a module component used for various electronic devices, communication devices, etc.

BACKGROUND ART

Conventional module components are configured of a circuit board 21 carrying one or more mount device 23 at least o one side thereof, a ground electrode 24 provided on the side surface of the circuit board 21, and a metal case 22 covering the mount devices 23. And, electric shield is achieved with a configuration in which one end of the metal case 22 is connected with the ground electrode 24 by means of solder. In order for the metal case 22 to be connected with the side surface of the circuit board 21 by means of solder as in the conventional module component described above, the thickness of the circuit board 21 is needed to be large enough for the metal case 22 to be able of supporting itself. Moreover, if the mount device 23 carried by the circuit board 21 comes in contact with the metal case 22, short circuit or disorders in circuit operation caused by external stress takes place. For the prevention of such troubles, the height of the metal case 22 needs be made larger than the height of the mount devices 23. Furthermore, in the connection of the circuit board 21 with the metal case 22, care is taken so that the metal case 22 never comes in contact with the circuit pattern and the mount devices 23 formed on the surface of the circuit board 21. For that purpose, a clearance is provided between the circuit board 21 and the metal case 22.

And, a terminal formed on the metal case 22 is connected with the ground electrode 24. As the result of these measures, thinning of the component is difficult, and the shield effect tends to be imperfect. In view of the problems mentioned above, the invention has an object of making a module component low in height and achieving a sufficient shield effect.

DISCLOSURE OF THE INVENTION

A module component is provided comprising a circuit board carrying a mount device comprising an electronic part, a sealing body that has the same outer shape as that of the circuit board and seals the mount device with a first resin, and a metal film covering the surface of the sealing body and the side surface of the circuit board, wherein a ground pattern is formed at the outermost periphery of the uppermost layer surface of the circuit board and wherein the metal film and the side end portion of the ground pattern is conductively connected.

Moreover, a module component is provided comprising a circuit board carrying a mount device comprising an electronic part, a sealing body that has the same outer shape as that of the circuit board and seals the mount device with a first resin, and a metal film covering the surface of the sealing body and the side surface of the circuit board, wherein the sealing body has a dividing groove corresponding to a predetermined circuit block and in at least either of the bottom surface or the side surface of the dividing groove the metal film is connected with the ground pattern of the circuit board.

DETAILED DESCRIPTION OF PREFERRED EMBODIMENTS

In the following, embodiments of the invention are described with reference to the drawings.

By way of precaution, the drawings are schematic ones, and thus do not show individual positions in a dimensionally correct form.

(First Embodiment)

Figure 1:
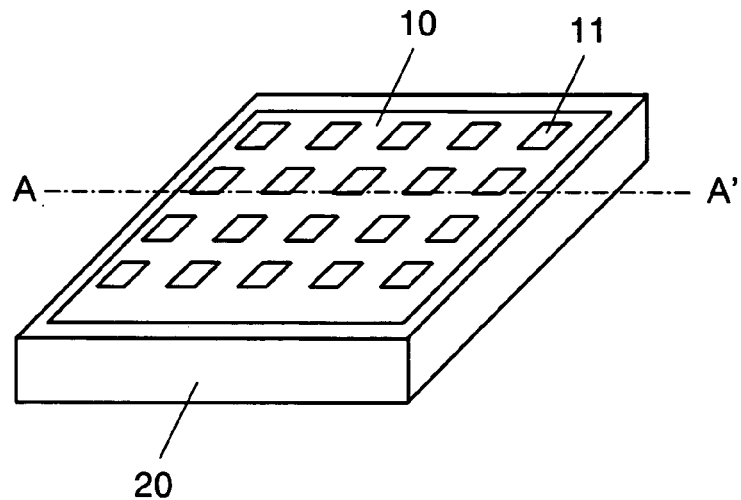
FIG. 1 is a perspective view of a module component as a first embodiment of the invention.
Figure 2:
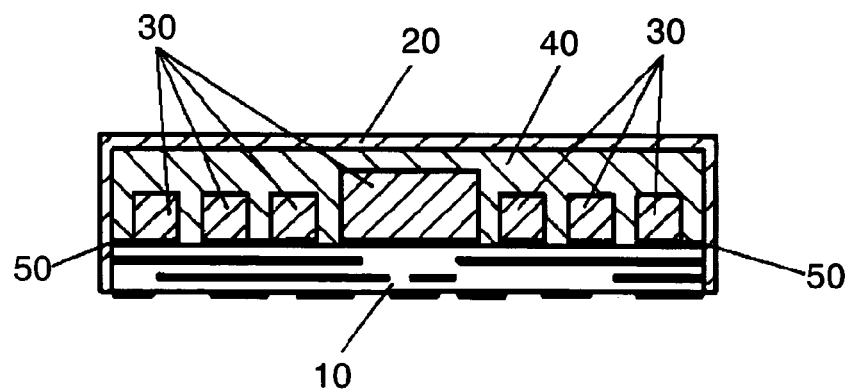
FIG. 2 is a cross-sectional view of a module component as the first embodiment of the invention at the section shown by line A–A'.

By using FIGS. 1 and 2, the module component in the first embodiment of the invention is described. The circuit board 10 is configured of a multi-layer substrate.

In this multi-layer substrate, circuit patterns such as those for a power supply, ground, high frequency, etc. are fabricated in at least two wiring layers.

Figure 3:
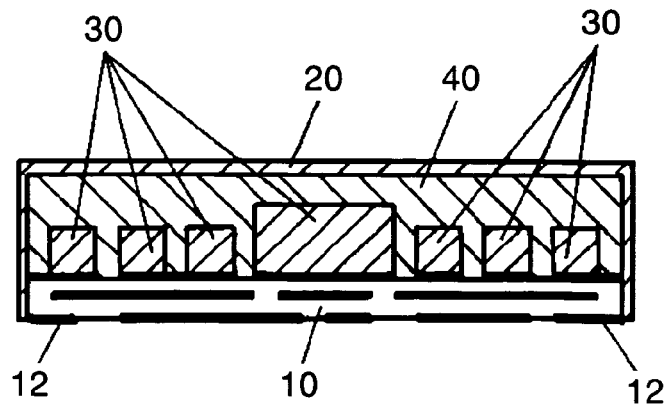
FIG. 3 is a cross-sectional view of a module component as another example of the first embodiment of the invention.

On the principal surface of this circuit board 10, mount devices 30 such as a resistor, a capacitor, a coil, a semiconductor, a quartz oscillator, etc. are mounted. The connection among them is achieved by using a lead-free solder. Furthermore, such connection may be achieved by means of an electro-conductive adhesive. Publicly known electro-conductive adhesives can be used. At the rear surface of the circuit board 10, an electrode 11 is provided which is to be connected with a mother board (not shown in the drawing). And, a sealing body 40 made of an epoxy-based resin as a first resin is configured so as to cover these mount devices 30 to have the same outer shape as that of the circuit board 10. Further, on the surface of this sealing body 40 and the side surface of the circuit board 10, a metal film 20 is formed. This metal film 20 is connected with a first ground pattern 50 formed on the four sides of the outermost periphery in the principal surface of the circuit board 10. With such a configuration, the circuit board 10 is covered with the metal film 20 except for the electrode 11 on the rear surface thereof. As a result, a reliable shield effect is attained. As is shown in FIG. 2, it is possible to connect a ground pattern 50 formed on the principal surface of the circuit board 10 with the metal film 20. Moreover, as is shown in FIG. 3, it is further possible to connect the side end of the ground pattern 12 formed in the outer periphery of the rear surface of the circuit board 10 with the metal film 20. And, when the thickness of the metal film 20 is about 1 μm or more, a sufficient shield effect is attained. This metal film 20 can be fabricated by first forming a layer made of copper and the like by means of electroless plating on the surface of the sealing body 40, and then further covering its surface with an electroplated layer. By such procedure, the metal film 20 is made dense and close. As a result, the contact resistance with the ground pattern 50 can be made low, thus improving the shield effect since the ground potential of the metal film 20 formed on the sealing body 40 is stabilized.

As are shown in FIGS. 2 and 3, a configuration is adopted in which the projected area of the sealing body 40 covered with the metal film 20 is equal to the projected area of the circuit board 10.

Since there is no bump between the sealing body 40 and the circuit board 10, it becomes possible to uniformly achieve an intimate contact of the metal film 20 formed by electroless plating together with electroplating. As a result, the peeling off of the sealing body 40 and the ground pattern 50 can be prevented. In this way, the ground pattern 50 formed on the circuit board 10 and the metal film 20 formed on the sealing body 40 are connected together. And, it becomes possible to reliably shield the circuit comprising the mount devices 30 provided on the circuit board 10.

(Second Embodiment)

Among the module component in the second embodiment, the same constituents as in the first embodiment are described with the same signs.

Figure 4:
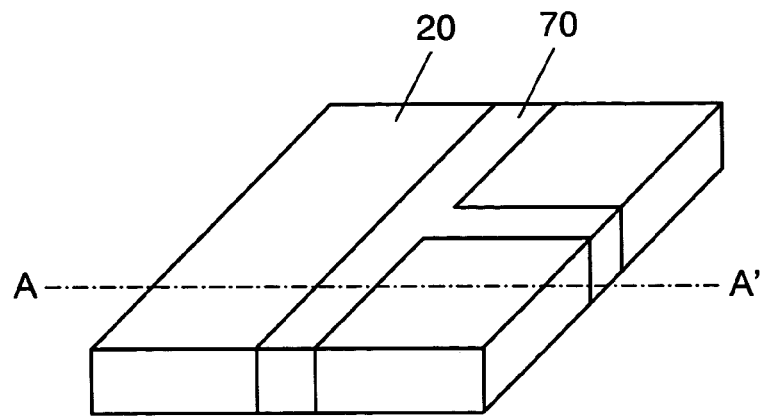
FIG. 4 is a perspective view of a module component as a second embodiment of the invention.
Figure 5:
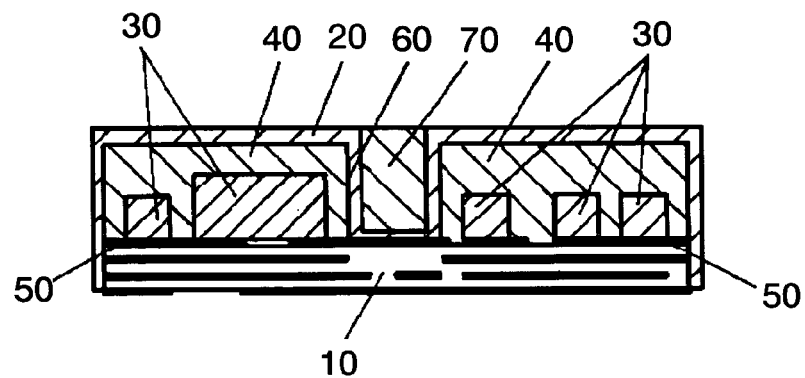
FIG. 5 is the cross-sectional view of a module component as the second embodiment of the invention at the section shown by line A–A'.

As is shown in FIG. 4, the sealing body 40 covered with the metal film 20 is divided into three blocks by means of a sealing body 70 made of a second resin. In the circuit board 10, as is shown in FIG. 5, circuit patterns such as those for a power supply, ground or high frequency, which have been described in the first embodiment are provided in at least two wiring layers. In the outer periphery of the principal surface of the circuit board 10 is formed a first ground pattern 50. Further, on the principal surface of the circuit board 10, the mount devices 30 such as a resistor, a capacitor, a coil, a semiconductor, a quartz oscillator and the like are mounted. And the sealing body 40 having the same outer shape as that of the circuit board 10 is provided so as to cover these mount devices 30. Still further, a dividing groove 60 is provided in the sealing body 40 for the purpose of dividing the component into predetermined circuit blocks.

On the surface of the sealing body 40 as well as the dividing groove 60, the metal film 20 is formed in such a manner as to be connected with the surface of the ground pattern 50.

Moreover, the sealing body 70 made of the second resin is provided on the metal film 20 formed in the dividing groove 60.

Figure 6:
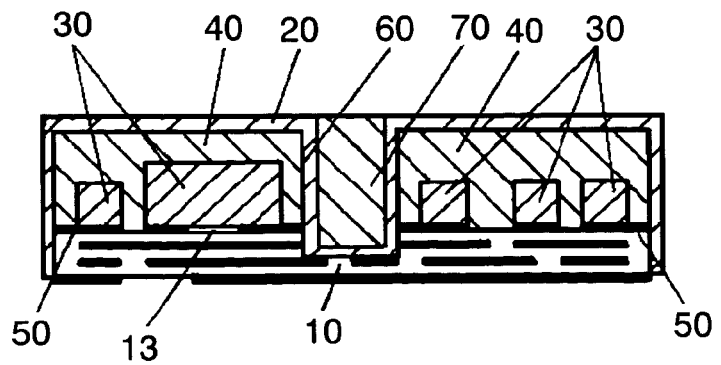
FIG. 6 is a cross-sectional view of a module component as another example of the second embodiment of the invention.
Figure 7:
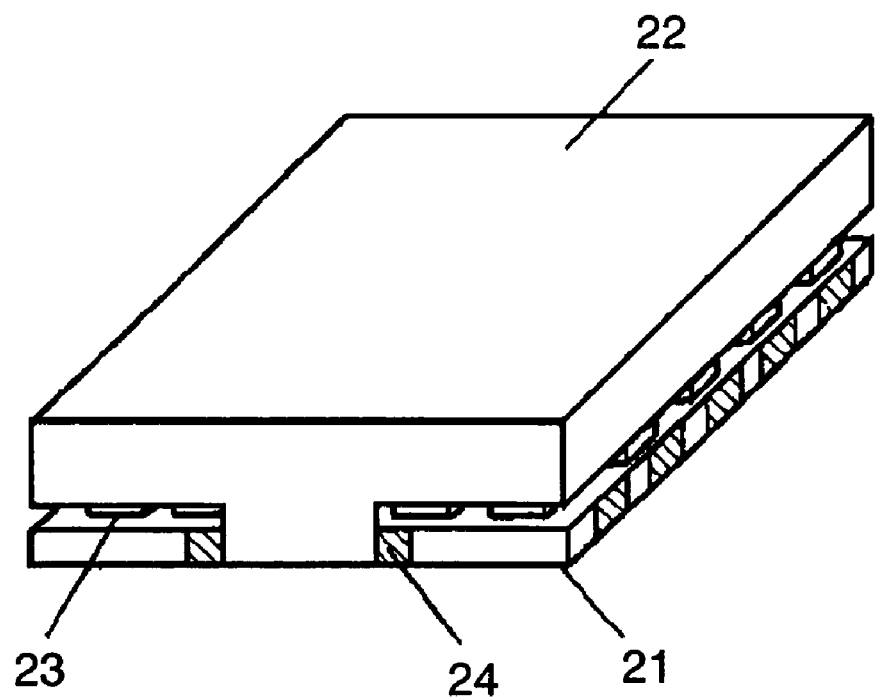
FIG. 7 is a perspective view of a conventional module component.

As has been stated hereinabove, the dividing groove 60 that divides mount devices 30 into predetermined circuit blocks is provided, and then those blocks are covered with the sealing body 40. On the surface of each circuit block, the metal film 20 is provided so as to be in connection with the first ground pattern 50. In this way, each predetermined circuit block is electrically shielded from each other. As a result, the module component can be configured small in size, because there is no interference of electric noise among the module components each having a plurality of circuit blocks. Further, the sealing body 70 made of the second resin is formed in the dividing groove 60. As a result, even with a small thickness resulting from height reduction, the module component has a sufficient bending strength and can maintain its deformation small. And, since the reliability in the contact between the metal film 20 and the ground pattern 50 is secured, shielding performance is also enhanced. FIG. 6 illustrates an example in which the metal film 20 is configured so as to be in connection with the ground pattern formed within the circuit board 10. In such a case, it becomes possible to shield part of the circuit pattern formed within the circuit board 10. As a result, the shield effect is still further enhanced compared with the example illustrated in FIG. 5.

In addition, a sealing body 13 made of a third resin is arranged in the clearance between the circuit board 10 and the mount devices 30 comprising electronic parts. In this way, the air present in the aforementioned clearance is excluded, thus enabling further enhancement of reliability.

Incidentally, the sealing bodies each made of the first, second or third resin may be the same or different. As the composition thereof, in addition to epoxy-based resins, insulating resin compositions incorporated with a variety of inorganic fillers can be used. Those resin compositions that have a good heat-resistance and a good thermal conductivity are particularly preferred. As an example, the composition comprising a silicone resin containing alumina particles can be mentioned.

INDUSTRIAL APPLICABILITY

As has been explained hereinabove, a module component is provided having a configuration which carries, on a circuit board, a mount device comprising an electronic part, and has a sealing body that seals the mount device with a resin and a metal film covering the surface of the sealing body, wherein a ground pattern is formed at the outer periphery of the principal surface of the circuit board and wherein the metal film and the ground pattern are conductively connected.

With such a configuration, one can provide a module component that has an enhanced shield effect and can be made small in size.

The invention claimed is:

1. A module component comprising:
   a circuit board carrying a mount device comprising an electronic part,
   a sealing body that has the same outer shape as the outer shape of the circuit board and seals said mount device with a first resin, and
   a metal film covering the surface of the sealing body and the side surface of the circuit board,
   wherein (1) the sealing body has a dividing groove corresponding to a predetermined circuit block, (2) the dividing groove is sealed with a second resin, and (3) the metal film is connected to the ground pattern of the circuit board in at least one of a bottom surface of the dividing groove and a side surface of the dividing groove.

2. The module component of claim 1, wherein (1) the sealing body has a dividing groove corresponding to the predetermined circuit block, and (2) the circuit block is electrically shielded from another circuit block.

3. The module component in claim 1 wherein the metal film has a configuration prepared by first forming a layer by means of electroless plating and then forming an electroplated layer on the layer formed by electroless plating.

* * * * *